US010068884B2

(12) United States Patent
Takeya et al.

(10) Patent No.: US 10,068,884 B2
(45) Date of Patent: Sep. 4, 2018

(54) DISPLAY APPARATUS AND MANUFACTURING METHOD THEREOF

(71) Applicant: Seoul Semiconductor Co., Ltd., Ansan-si (KR)

(72) Inventors: Motonobu Takeya, Ansan-si (KR); Young Hyun Kim, Ansan-si (KR); Jong Ik Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/476,469

(22) Filed: Mar. 31, 2017

(65) Prior Publication Data

US 2017/0287887 A1    Oct. 5, 2017

Related U.S. Application Data

(60) Provisional application No. 62/316,927, filed on Apr. 1, 2016.

(51) Int. Cl.
*H01L 21/00* (2006.01)
*H01L 29/20* (2006.01)
*H01L 25/16* (2006.01)

(52) U.S. Cl.
CPC .... *H01L 25/167* (2013.01); *H01L 2933/0041* (2013.01)

(58) Field of Classification Search
CPC ........................................................ H01L 33/26
USPC .................................. 438/29–32; 257/88–98
See application file for complete search history.

(56) References Cited

U.S. PATENT DOCUMENTS

| 6,621,540 B2* | 9/2003 | Noritake ........... G02F 1/133553 349/113 |
| 8,766,292 B2* | 7/2014 | Kim .................... H01L 27/3216 257/89 |
| 2008/0192237 A1* | 8/2008 | Yamamoto .......... G02F 1/13338 356/73 |
| 2009/0066259 A1* | 3/2009 | Hwang ................. H01L 27/322 315/169.3 |
| 2014/0152637 A1* | 6/2014 | Fujita .................... C07F 15/002 345/211 |

(Continued)

FOREIGN PATENT DOCUMENTS

| JP | 2013-037138 | 2/2013 |
| JP | 2015-500562 | 1/2015 |
| KR | 10-2013-0137985 | 12/2013 |

(Continued)

*Primary Examiner* — Calvin Lee
(74) *Attorney, Agent, or Firm* — H.C. Park & Associates, PLC

(57) ABSTRACT

A display apparatus including a first substrate including a plurality of light emitting diodes regularly disposed thereon, a second substrate including a thin-film transistor (TFT) panel part including a plurality of TFTs configured to drive the light emitting diodes, and a third substrate including a light converter configured to convert light emitted from the first substrate, in which the first substrate and the second substrate are coupled to face each other, the light emitting diodes are electrically connected to the TFTs, respectively, the first substrate and the third substrate are coupled to face each other, and light emitted from the light emitting diodes is converted into at least one of blue light, green light, and red light through the light converter.

20 Claims, 3 Drawing Sheets

(56) References Cited

U.S. PATENT DOCUMENTS

2014/0299837 A1  10/2014  Bibl et al.
2015/0249120 A1   9/2015  Cheng et al.

FOREIGN PATENT DOCUMENTS

KR      10-1524726     6/2015
KR    10-2015-0077764  7/2015

\* cited by examiner

DISPLAY APPARATUS AND MANUFACTURING METHOD THEREOF

CROSS-REFERENCE TO RELATED APPLICATION

This application claims the benefit of U.S. Provisional Patent Application No. 62/316,927, filed on Apr. 1, 2016, which is hereby incorporated by reference for all purposes as if fully set forth herein.

BACKGROUND

Field

Exemplary embodiments relate to a display apparatus and a method of manufacturing the same, and more particularly, to a display apparatus using micro-light emitting diodes and a method of manufacturing the same.

Discussion of the Background

A light emitting diode generally refers to an inorganic semiconductor device that emits light through recombination of electrons and holes. A light emitting diode has recently been used in various fields including displays, automobile lamps, general lighting, and the like. A light emitting diode has various advantages, such as long lifespan, low power consumption, and rapid response. As a result, a light emitting device using a light emitting diode is used as a light source in various fields.

Recently, smart TVs or monitors realize colors using a thin-film transistor liquid crystal display (TFT-LCD) panel and may use light emitting diodes (LEDs) as a light source for a backlight unit for color realization. In addition, a display apparatus is often manufactured using organic light emitting diodes (OLEDs).

In a TFT-LCD, since one LED is used as a light source for many pixels, a backlight light source must be kept in a turned-on state. As a result, the TFT-LCD suffers from constant power consumption regardless of brightness of a displayed screen. On the other hand, although power consumption of an OLED has been continuously reduced due to advances in technology, the OLED still has a much higher power consumption than LEDs formed of inorganic semiconductors, and thus, has a lower efficiency than LEDs.

Moreover, a passive matrix (PM) drive type OLED may suffer from deterioration in response speed from controlling pulse amplitude modulation (PAM) of the OLED having large capacitance, and may also suffer from deterioration in lifespan from high current driving of pulse width modulation (PWM) for realizing low duty ratio. Moreover, an active matrix (AM) driving type OLED may require connection of TFTs for each pixel, which may increase manufacturing costs and non-uniform brightness according to characteristics of TFTs.

SUMMARY

Exemplary embodiments provide a display apparatus using micro-light emitting diodes having low power consumption that may be applicable to a wearable apparatus, a smartphone, or a TV, and a method of manufacturing the same.

In accordance with one exemplary embodiment, a display apparatus includes a first substrate including a plurality of light emitting diodes regularly disposed thereon, a second substrate including a thin-film transistor (TFT) panel part including a plurality of TFTs configured to drive the light emitting diodes, and a third substrate including a light converter configured to convert light emitted from the first substrate, in which the first substrate and the second substrate are coupled to face each other, the light emitting diodes are electrically connected to the TFTs, respectively, the first substrate and the third substrate are coupled to face each other, and light emitted from the light emitting diodes is converted into at least one of blue light, green light, and red light through the light converter.

The light converter may include a phosphor layer configured to convert wavelengths of light emitted from the light emitting diodes and a filter unit blocking light of a predetermined wavelength among light having passed through the phosphor layer.

In accordance with an exemplary embodiment, a method of manufacturing a display apparatus includes forming a first substrate having a plurality of light emitting diodes regularly arranged thereon, forming a second substrate including a thin-film transistor (TFT) panel part including a plurality of TFTs configured to drive the light emitting diodes, forming a third substrate including a light converter configured to convert light emitted from the first substrate, and coupling the first, second, and third substrates to one another, in which light emitted from the light emitting diodes is converted into one of blue light, green light, and red light through the light converter.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Figure 1:
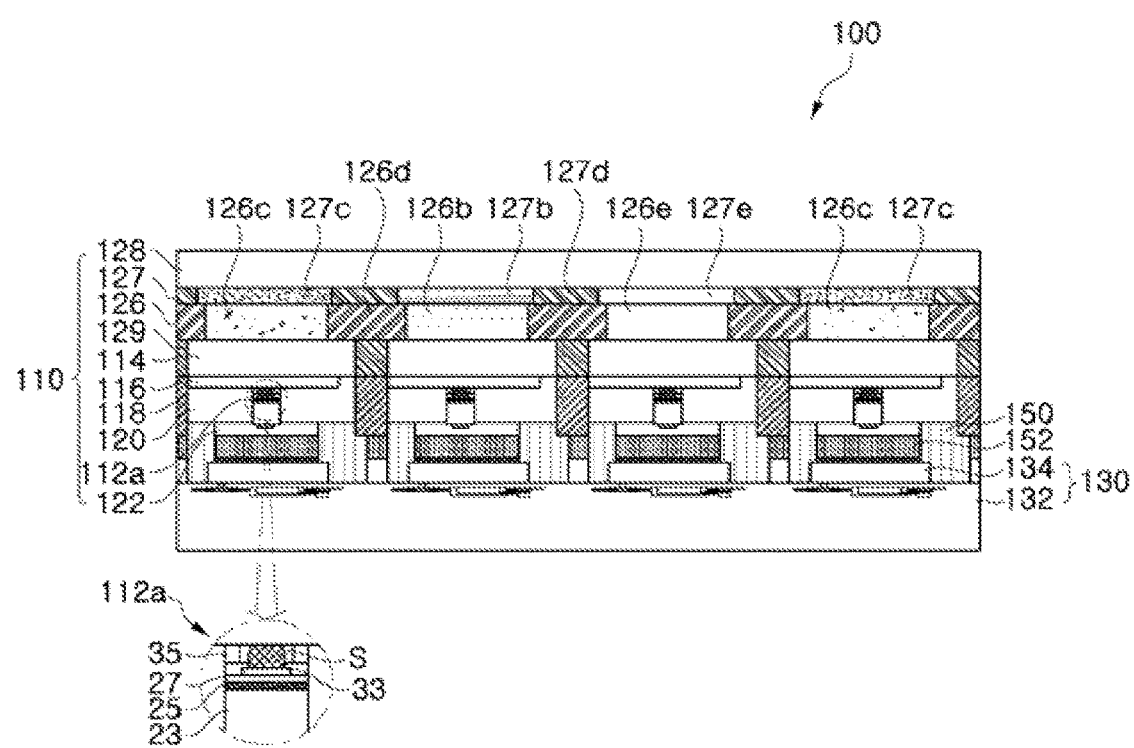
FIG. 1 is a cross-sectional view of a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described in detail with reference to the accompanying drawings.

Figure 2A:
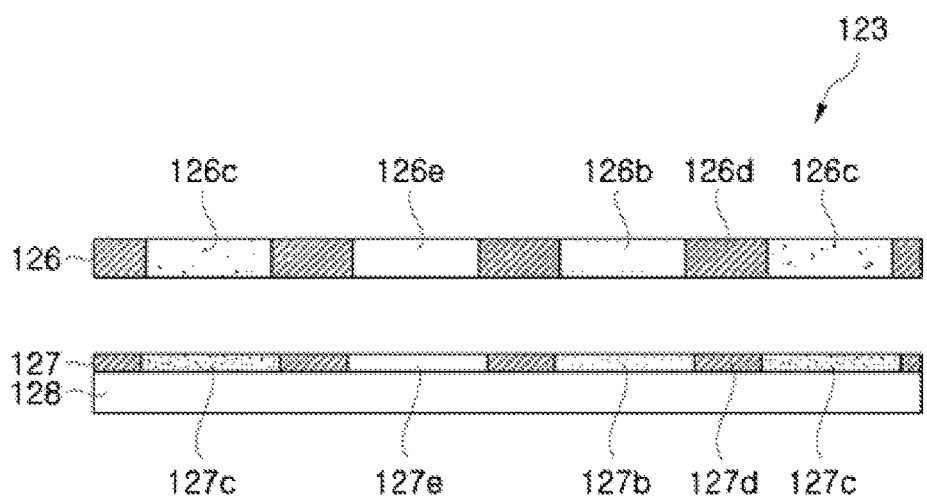
FIG. 2A and FIG. 2B are cross-sectional views illustrating a method of manufacturing the display apparatus according to an exemplary embodiment.
Figure 2B:
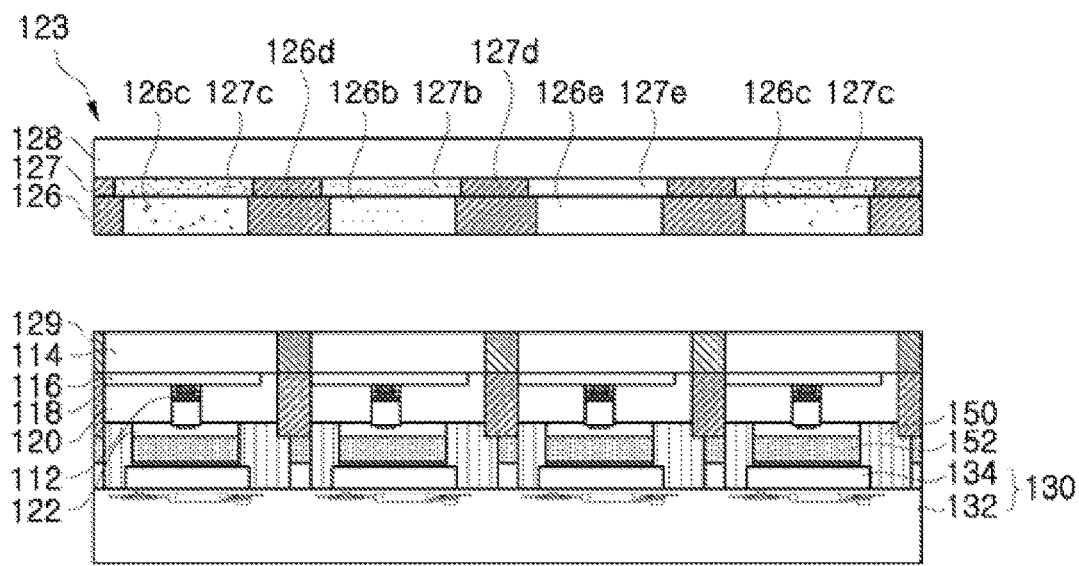

FIG. 1 is a cross-sectional view of a display apparatus according to an exemplary embodiment. FIG. 2A and FIG. 2B are cross-sectional views illustrating a method of manufacturing the display apparatus according to an exemplary embodiment.

Referring to FIG. 1, the display apparatus 100 according to an exemplary embodiment includes a light emitting diode part 110, a TFT panel part 130, and an anisotropic conductive film 150.

The light emitting diode part 110 includes light emitting diodes 112a, a support substrate 114, transparent electrodes 116, a first blocking portion 118, an insulation layer 120, first connection electrodes 122, a phosphor layer 126, a color filter 127, and a protective substrate 128.

The light emitting diode part 110 includes a plurality of light emitting diodes 112a, which are regularly arranged on the support substrate 114. For example, the light emitting diodes 112a may be arranged at constant intervals in a matrix form. The plurality of light emitting diodes 112a may include, for example, blue light emitting diodes emitting blue light.

In the display apparatus 100, the light emitting diode part 110 may be driven by power applied from an exterior power source. More particularly, an image may be reproduced through on/off combination of the light emitting diodes 112a in the light emitting diode part 110, and the wavelength of light emitted from the light emitting diodes 112a may be converted into red light, green light, and blue light through the phosphor layer 126. Accordingly, the display apparatus 100 may be driven without a separate LCD. In FIG. 1, a region including a single light emitting diode 112a may be used as a subpixel in the display apparatus 100. In the light emitting diode part 110, one subpixel may have a larger size than the light emitting diode 112a disposed in the subpixel.

Referring to an enlarged portion of FIG. 1, each of the light emitting diodes 112a includes an n-type semiconductor layer 23, an active layer 25, a p-type semiconductor layer 27, an n-type electrode 31, a p-type electrode 33, and a wall 35.

The n-type semiconductor layer 23, the active layer 25, and the p-type semiconductor layer 27 may include Group III-V based compound semiconductors. For example, the n-type semiconductor layer 23, the active layer 25, and the p-type semiconductor layer 27 may include nitride semiconductors such as (Al, Ga, In)N. According to an exemplary embodiment, however, locations of the n-type semiconductor layer 23 and the p-type semiconductor layer 27 may be interchanged.

The n-type semiconductor layer 23 may include an n-type dopant (for example, Si) and the p-type semiconductor layer 27 may include a p-type dopant (for example, Mg). The active layer 25 is interposed between the n-type semiconductor layer 23 and the p-type semiconductor layer 27. The active layer 25 may have a multi-quantum well (MQW) structure, and the composition of the active layer 25 may be varied to emit light having a desired peak wavelength.

The light emitting structure including the n-type semiconductor layer 23, the active layer 25, and the p-type semiconductor layer 27 may have a structure that is similar to a vertical type light emitting diode 112a. In this case, the n-type electrode 31 may be formed on an outer surface of the n-type semiconductor layer 23, and the p-type electrode 33 may be formed on an outer surface of the p-type semiconductor layer 27.

As shown in the enlarged portion of FIG. 1, a bonding portion S may be formed between the p-type electrode 33 and the transparent electrode 116 to couple the light emitting diode 112a, which has a structure similar to that of a vertical type light emitting diode, to the transparent electrode 116 formed on the support substrate 114. Here, the wall 35 may be formed on the light emitting diode 112a to prevent the bonding portion S from escaping from a space between the p-type electrode 33 and the transparent electrode 116.

The wall 35 may be formed to cover a portion of the p-type electrode 33, such that the p-type electrode 33 may be exposed on the p-type semiconductor layer 27. The wall 35 may include a plurality of layers. For example, the wall 35 may include a first layer and a second layer, and may be formed by forming the first layer including SiN on the p-type semiconductor layer 27 to cover a portion of the p-type electrode 33, and then forming the second layer including $SiO_2$ on the first layer. The second layer may have a greater thickness and a smaller width than the first layer.

The support substrate 114 is a substrate on which the plurality of light emitting diodes 112a may be mounted. The support substrate 114 may be an insulation substrate, a conductive substrate, or a printed circuit board. For example, the support substrate 114 may be at least one of a sapphire substrate, a gallium nitride substrate, a glass substrate, a silicon carbide substrate, a silicon substrate, a metal substrate, and a ceramic substrate. According to an exemplary embodiment, the support substrate 114 may be a transparent substrate that may transmit light emitted from the light emitting diodes 112a. For example, the support substrate 114 may be a flexible glass substrate having a certain thickness.

The support substrate 114 may include a transparent material. Light emitted from the plurality of light emitting diodes 112a may be emitted to the outside through the support substrate 114, and through the phosphor layer 126 and the color filter 127 formed on an upper surface of the support substrate 114. The support substrate 114 is divided into a plurality of support substrates separated from each other, which may overlap only the corresponding light emitting diodes 112a. In addition, a second blocking portion 129 may be disposed in a space between the support substrates 114.

The second blocking portion 129 may block light emitted from one light emitting diode 112a from traveling towards another light emitting diode 112a adjacent thereto. More particularly, each of the second blocking portions 129 is disposed between the support substrates 114, such that light emitted from one light emitting diode 112a may be discharged to the outside through the support substrate 114 disposed on the light emitting diode 112a, the phosphor layer 126, and the color filter 127 disposed thereon.

The transparent electrode 116 may be formed on the support substrate 114, and may be electrically connected to the p-type electrode 33 of the light emitting diode 112a. In FIG. 1, a plurality of transparent electrodes 116 may be formed on the support substrate 114 and may be coupled to the plurality of light emitting diodes 112a, respectively. Alternatively, the plurality of light emitting diodes 112a may be coupled to one transparent electrode 116, as needed. In addition, the transparent electrodes 116 may be separated from each other on the support substrate 114. The transparent electrodes 116 may include indium tin oxide (ITO) and the like.

The first blocking portion 118 is formed on the support substrate 114 and may be provided in plural. The first blocking portion 118 prevents light emitted from a certain light emitting diode 112a from being directed towards other light emitting diodes 112a adjacent thereto, when light emitted from the light emitting diodes 112a is emitted to the outside through the transparent electrodes 116. Accordingly, each of the first blocking portions 118 may be formed between the transparent electrodes 116 separated from each other, and may be formed to cover a portion of each of the transparent electrodes 116, as needed. The first blocking portion 118 may include, for example, aluminum (Al) or chromium (Cr).

The insulation layer 120 may surround the light emitting diode 112a. The insulation layer 120 may cover an exposed surface of a connecting plane between the light emitting diode 112a and the transparent electrode 116, while covering the transparent electrode 116. When the insulation layer 120 surrounds the light emitting diode 112a, the n-type semiconductor layer 23 and the n-type electrode 31 of the light emitting diode 112a may be exposed through the insulation layer 120.

The first connection electrode 122 covers the insulation layer 120, and may also cover the n-type semiconductor layer 23 and the n-type electrode 31 not covered by the insulation layer 120. Accordingly, the first connection electrode 122 may be electrically connected to the n-type semiconductor layer 23.

The phosphor layer 126 may be formed on an upper surface of the support substrate 114, and may include a green phosphor layer 126b, a red phosphor layer 126c, and a transparent layer 126e. The green phosphor layer 126b, the red phosphor layer 126c, and the transparent layer 126e may be alternately arranged to be adjacent to one another, or may be separated from one another at a predetermined distance. A blocking layer 126d may be disposed between the green phosphor layer 126b, the red phosphor layer 126c, and the transparent layer 126e separated from one another at a predetermined distance. The blocking layer 126d may fill the spaces between the green phosphor layer 126b, the red phosphor layer 126c, and the transparent layer 126e, and may prevent light emitted through each of the green phosphor layer 126b, the red phosphor layer 126c, and the transparent layer 126e from traveling towards another phosphor layer adjacent thereto.

The light emitting diodes 112a may be blue light emitting diodes. Accordingly, the green phosphor layer 126b converts the wavelength of blue light emitted from the light emitting diodes 112a into green light, and the red phosphor layer 126c converts the wavelength of blue light emitted from the blue light emitting diodes 112a into red light. In addition, the transparent layer 126e transmits blue light emitted from the light emitting diodes 112a therethrough without a wavelength conversion. Accordingly, green light, red light, and blue light may be emitted through the phosphor layer 126.

The color filter 127 may be disposed on an upper surface of the phosphor layer 126, and may include a green light portion 127b, a red light portion 127c, a light blocking portion 127d, and a transparent portion 127e. The color filter 127 may be a film-type, which may block light having an undesired wavelength among light that passed through the color filter 127.

In particular, the green light portion 127b may transmit only green light therethrough by blocking light having other wavelengths than the wavelength of the green light, and the red light portion 127c may transmit only red light therethrough by blocking light having other wavelengths than the red light. In addition, the light blocking portion 127d is disposed between the green light portion 127b, the red light portion 127c, and the transparent portion 127e, and blocks all components of light. In addition, the transparent portion 127e transmits light therethrough without a wavelength conversion.

In FIG. 1, the green light portion 127b, the red light portion 127c, and the transparent portion 127e of the color filter 127 may be arranged in the same manner as those of the phosphor layer 126. That is, the green light portion 127b of the color filter 127 is disposed on an upper surface of the green phosphor layer 126b, and the red light portion 127c is disposed on an upper surface of the red phosphor layer 126c. Further, the transparent portion 127e may be disposed on an upper surface of the transparent layer 126e that transmits blue light emitted from the light emitting diodes 112a without a wavelength conversion.

The green light portion 127b, the red light portion 127c, and the transparent portion 127e may have greater widths than the green phosphor layer 126b, the red phosphor layer 126c, and the transparent layer 126e, respectively. As a result, the entirety of light having passed through the phosphor layer 126 may be discharged to the outside through the color filter 127.

As such, since the red light portion 127c is disposed on the upper surface of the red phosphor layer 126c, light of other wavelengths included in the light having passed through the red phosphor layer 126c may be blocked by the red light portion 127c. In this manner, only red light may be discharged through the red light portion 127c. In addition, since the green light portion 127b is disposed on the upper surface of the green phosphor layer 126b, light having other wavelengths included in the light having passed through the green phosphor layer 126b may be blocked by the green light portion 127b. In this manner, only green light may be discharged through the green light portion 127b.

More particularly, blue light emitted from the light emitting diodes 112a is converted into red light while passing through the red phosphor layer 126c, and a fraction of the blue light that is not subjected to a wavelength conversion may be discharged to the outside. Likewise, blue light emitted from the light emitting diodes 112a is converted into green light while passing through the green phosphor layer 126b, such that the green light may be discharged to the outside together with a fraction of the blue light. Accordingly, since a fraction of blue light passes through the phosphor layer 126 without a wavelength conversion, which may deteriorate color purity, the color filter 127 may completely block this fraction of blue light to allow a pure color obtained through a wavelength conversion to be discharged to the outside.

Alternatively, in order to reduce the fraction of blue light that is not subjected to wavelength conversion, the thickness of the phosphor layer 126 may be reduced for conversion of the wavelength of light emitted from the light emitting diodes 112a, instead of using the color filter 127. In this case, however, the intensity of light may be reduced as the thickness of the phosphor layer 126 is decreased. Therefore, the thickness of the phosphor layer 126 and the use of the color filter 127 may be suitably adjusted so as to emit a desired color.

The protective substrate 128 is disposed on an upper surface of the color filter 127 and may protect the color filter 127 from an external environment, by preventing the color filter 127 from being directly exposed to the outside. The protective substrate 128 may include a transparent material.

The TFT panel part 130 includes a panel substrate 132 and second connection electrodes 134, and is coupled to the light emitting diode part 110 to supply power to the light emitting diode part 110. The TFT panel part 130 may control power supply to the light emitting diode part 110, such that only a portion of the light emitting diodes 112a in the light emitting diode part 110 may emit light.

The panel substrate 132 has a TFT drive circuit therein. The TFT drive circuit may be a circuit for driving an active matrix (AM) or a circuit for driving a passive matrix (PM).

The second connection electrodes 134 may be electrically connected to the TFT drive circuit of the panel substrate 132 and to the first connection electrodes 122 of the light emitting diode part 110. In this manner, power supplied through the TFT drive circuit may be supplied to each of the light emitting diodes 112a through the first and second connection electrodes 122 and 134. The second connection electrodes 134 may be covered by a separate protective layer (not shown), which may include, for example, $SiN_x$.

The anisotropic conductive film 150 may electrically connect the light emitting diode part 110 to the TFT panel part 130. The anisotropic conductive film 150 may include an adhesive organic insulation material and conductive particles uniformly dispersed therein for electrical connection. The anisotropic conductive film 150 may be conductive in the thickness direction thereof, and has insulating properties in the plane direction thereof. In addition, the anisotropic conductive film 150 may have adhesive properties. Thus, the anisotropic conductive film 150 may bond the light emitting diode part 110 to the TFT panel part 130, such that the light emitting diode part 110 may be electrically connected to the TFT panel part 130 therethrough. Particularly, the anisotropic conductive film 150 may connect ITO electrodes, which are known to be difficult to solder at high temperatures.

As such, when the light emitting diodes 112a are coupled to the TFT panel part 130 via the anisotropic conductive film 150, the first connection electrodes 122 of the light emitting diode part 110 may be electrically connected to the second connection electrodes 134 of the TFT panel part 130 via an electrode connection portion 152.

Referring to FIGS. 2A and 2B, the light emitting diode part 110 and the TFT panel part 130 may be separately manufactured, and a light converter 123 of the light emitting diode part 110 may also be separately manufactured. The light converter 123 may include the phosphor layer 126, the color filter 127, and the protective substrate 128. That is, as shown in FIG. 2A, the color filter 127 is formed on the protective substrate 128, and the phosphor layer 126 is formed on the color filter 127, thereby providing the light converter 123. As shown in FIG. 2B, with the light emitting diode part 110 coupled to the TFT panel part 130, the light converter 123 is coupled to the upper surface of the support substrate 114, thereby providing the display apparatus 100 of FIG. 1.

Figure 3:
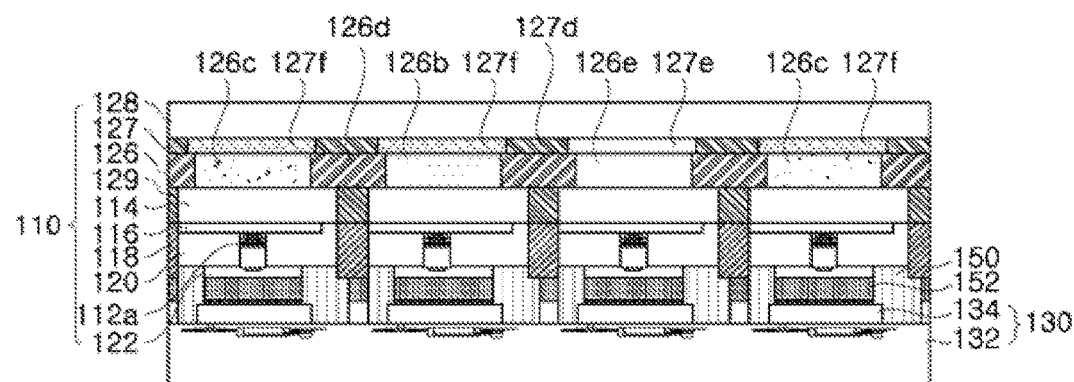
FIG. 3 is a cross-sectional view of a display apparatus according to an exemplary embodiment.

FIG. 3 is a cross-sectional view of a display apparatus according to an exemplary embodiment.

Referring to FIG. 3, the display apparatus 200 according to an exemplary embodiment includes a light emitting diode part 110, a TFT panel part 130, and an anisotropic conductive film 150. The display apparatus 200 according to an exemplary embodiment may include components that are substantially similar to that of the display apparatus 100 of FIG. 1, and thus, repeated descriptions of substantially similar components will be omitted.

Referring to FIG. 3, the color filter 127 includes a transparent portion 127e, a wavelength filter unit 127f, and a light blocking portion 127d. As in the display apparatus 100 of FIG. 1, the transparent portion 127e is disposed on an upper surface of the transparent layer 126e of the phosphor layer 126, and the wavelength filter unit 127f is disposed on an upper surface of each of the green phosphor layer 126b and the red phosphor layer 126c of the phosphor layer 126. Accordingly, the wavelength filter unit 127f and the transparent layer 126e are provided in plural and are separated from each other. The light blocking portion 127d may be disposed in a space between the wavelength filter unit 127f and the transparent layer 126e.

The wavelength filter unit 127f allows light having a predetermined wavelength or greater among light having passed through the green phosphor layer 126b or the red phosphor layer 126c to pass therethrough. In particular, the light emitting diodes 112a emit blue light, which is then converted into red light or green light while passing through the phosphor layer 126. Accordingly, the wavelength filter unit 127f may allow light having a predetermined wavelength or greater among light having passed through the red phosphor layer 126c or the green phosphor layer 126b, while blocking blue light, which has a shorter wavelength than the predetermined wavelength. For example, the wavelength filter unit 127f may block light having a wavelength of 480 nm or less.

Furthermore, each of the wavelength filter unit 127f and the transparent portion 127e may have a greater width than the green phosphor layer 126b, the red phosphor layer 126c, and the transparent layer 126e.

Figure 4:
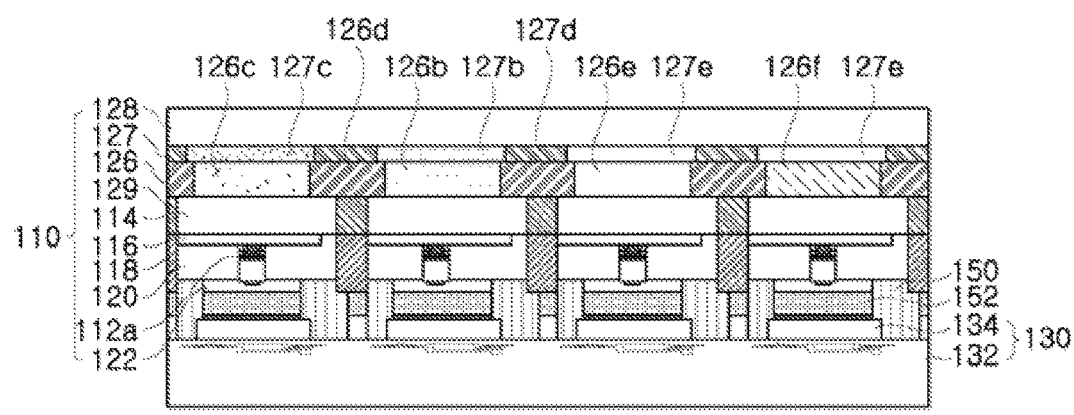
FIG. 4 is a cross-sectional view of a display apparatus according to an exemplary embodiment.

FIG. 4 is a cross-sectional view of a display apparatus according to an exemplary embodiment.

Referring to FIG. 4, the display apparatus 300 according to an exemplary embodiment includes a light emitting diode part 110, a TFT panel part 130, and an anisotropic conductive film 150. The display apparatus 300 according to an exemplary embodiment may include components that are substantially similar to that of the display apparatus 100 of FIG. 1, and thus, repeated descriptions of the substantially similar components will be omitted.

The phosphor layer 126 may include a green phosphor layer 126b, a red phosphor layer 126c, a transparent layer 126e, a white phosphor layer 126f, and a blocking layer 126d. In addition, the color filter 127 may include a green light portion 127b, a red light portion 127c, a transparent portion 127e, and a light blocking portion 127d.

The green phosphor layer 126b, the red phosphor layer 126c, the transparent layer 126e, and the white phosphor layer 126f may be alternately arranged to be adjacent to one another, or be separated from one another at a predetermined distance. The blocking layer 126d may be disposed between the green phosphor layer 126b, the red phosphor layer 126c, the transparent layer 126e, and the white phosphor layer 126f.

Furthermore, in the color filter 127, the green light portion 127b may be disposed on an upper surface of the green phosphor layer 126b, the red light portion 127c may be disposed on an upper surface of the red phosphor layer 126c, and the transparent portion 127e may be disposed on an upper surface of each of the transparent layer 126e and the white phosphor layer 126f. In this manner, green light may be emitted through the green light portion 127b and red light may be emitted through the red light portion 127c. In addition, blue light may be emitted through the transparent layer 126e and the transparent portion 127e, and white light may be emitted through the white phosphor layer 126f and the transparent portion 127e.

That is, in the display apparatus 300 according to an exemplary embodiment, four subpixels emitting blue light, green light, red light, and white light, respectively, may be driven is one pixel.

Figure 5:
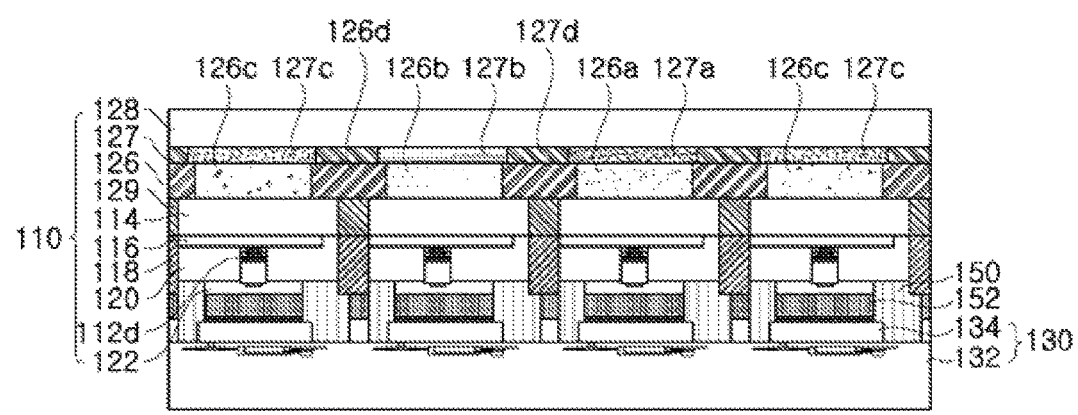
FIG. 5 is a cross-sectional view of a display apparatus according to an exemplary embodiment.

FIG. 5 is a cross-sectional view of a display apparatus according to an exemplary embodiment.

Referring to FIG. 5, the display apparatus 400 according to an exemplary embodiment includes a light emitting diode part 110, a TFT panel part 130, and an anisotropic conductive film 150. The display apparatus 400 according to an exemplary embodiment may include components that are substantially similar to that of the display apparatus 100 of FIG. 1, and thus, repeated descriptions of the substantially similar components will be omitted.

The light emitting diodes 112d of the light emitting diode part 110 may be ultra-violet (UV) light emitting diodes. The phosphor layer 126 may include a blue phosphor layer 126a, a green phosphor layer 126b, a red phosphor layer 126c, and a blocking layer 126d. The color filter 127 may include a blue light portion 127a, a green light portion 127b, a red light portion 127c, and a light blocking portion 127d.

In the phosphor layer 126, the blue phosphor layer 126a, the green phosphor layer 126b, and the red phosphor layer 126c may be disposed on upper surfaces of the UV light emitting diodes 112d, respectively, and may be alternately arranged to be adjacent to one another, or be separated from one another at a predetermined distance. The blocking layer 126d may be disposed between the blue phosphor layer 126a, the green phosphor layer 126b, and the red phosphor layer 126c.

The blue phosphor layer 126a converts the wavelength of UV light emitted from the UV light emitting diode 112d to emit blue light, the green phosphor layer 126b converts the wavelength of UV light emitted from the UV light emitting diode 112d to emit green light, and the red phosphor layer 126c converts the wavelength of UV light emitted from the UV light emitting diode 112d to emit red light.

Furthermore, in the color filter 127, the blue light portion 127a may be disposed on an upper surface of the blue phosphor layer 126a, the green light portion 127b may be disposed on an upper surface of the green phosphor layer 126b, and the red light portion 127c may be disposed on an upper surface of the red phosphor layer 126c. That is, the blue light portion 127a, the green light portion 127b, and the red light portion 127c may be disposed on the upper surfaces of the blue phosphor layer 126a, the green phosphor layer 126b, and the red phosphor layer 126c, respectively, and may be alternately arranged to be adjacent to one another. In addition, the blue light portion 127a, the green light portion 127b, and the red light portion 127c may be separated from one another at a predetermined distance, and the light blocking portion 127d may be disposed between the blue light portion 127a, the green light portion 127b, and the red light portion 127c separated from one another.

Light having passed through the blue phosphor layer 126a may include blue light subjected to wavelength conversion and UV light not subjected to wavelength conversion, and the blue light portion 127a allows only the blue light to be discharged to the outside by blocking the UV light among the light having passed through the blue phosphor layer 126a. In addition, light having passed through the green phosphor layer 126b may include green light subjected to wavelength conversion and UV light not subjected to wavelength conversion, and the green light portion 127b allows only the green light to be discharged to the outside by blocking the UV light among the light having passed through the green phosphor layer 126b. Furthermore, light having passed through the red phosphor layer 126c may include red light subjected to wavelength conversion and UV light not subjected to wavelength conversion, and the red light portion 127c allows only the red light to be discharged to the outside by blocking the UV light among the light having passed through the red phosphor layer 126c.

According to exemplary embodiments, the display apparatus includes micro-light emitting diodes formed of nitride semiconductors, which may provide high efficiency and high resolution that may be applicable to a wearable apparatus, while reducing power consumption.

In addition, the display apparatus according to the exemplary embodiments includes a color filter to block a fraction of light not subjected to a wavelength conversion, when light emitted from light emitting diodes is subjected to a wavelength conversion while passing through a phosphor layer, thereby improving color purity of light emitted to the outside.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A method of manufacturing a display apparatus, the method comprising:
    forming a first substrate having a plurality of light emitting diodes regularly arranged thereon;
    forming a second substrate comprising a thin-film transistor (TFT) panel part comprising a plurality of TFTs configured to drive the light emitting diodes;
    forming a third substrate comprising a light converter, comprising:
        forming a filter unit on a protective substrate, the filter unit comprising a plurality of filters having a first width to block light of a predetermined wavelength among light passing therethrough; and
        forming a plurality of phosphor layers on the filter unit, the phosphor layers having a second width less than the first width to convert the wavelength of light passing therethrough; and
    coupling the first, second, and third substrates to one another,
    wherein light emitted from the light emitting diodes is converted into one of blue light, green light, and red light through the light converter.

2. The method of claim 1, wherein:
    the light emitting diodes comprise blue light emitting diodes;
    the phosphor layers comprise:
        a green phosphor layer configured to emit green light through a wavelength conversion of blue light emitted from the blue light emitting diodes;
        a red phosphor layer configured to emit red light through a wavelength conversion of blue light emitted from the blue light emitting diodes;
        a transparent layer transmitting blue light emitted from the blue light emitting diodes therethrough without a wavelength conversion; and
        a white phosphor layer configured to emit white light through a wavelength conversion of blue light emitted from the blue light emitting diodes; and
    the filters of the filter unit comprise:
        a green light portion disposed on the green phosphor layer and blocking light of a predetermined wavelength among light having passed through the green phosphor layer;
        a red light portion disposed on the red phosphor layer and blocking light of a predetermined wavelength among light having passed through the red phosphor layer; and
        a transparent portion disposed on the transparent layer and the white phosphor layer, and transmitting light having passed through the transparent layer and the white phosphor layer therethrough without a wavelength conversion.

3. The method of claim 1, wherein:
    the light emitting diodes comprise ultra-violet (UV) light emitting diodes configured to emit UV light;
    the phosphor layers comprise:
        a blue phosphor layer configured to emit blue light through a wavelength conversion of UV light emitted from the UV light emitting diodes;
        a green phosphor layer configured to emit green light through a wavelength conversion of UV light emitted from the UV light emitting diodes; and
        a red phosphor layer configured to emit red light through a wavelength conversion of UV light emitted from the UV light emitting diodes; and
    the filters of the filter unit comprise:
        a blue light portion disposed on the blue phosphor layer and blocking light of a predetermined wavelength among light having passed through the blue phosphor layer;
        a green light portion disposed on the green phosphor layer and blocking light of a predetermined wavelength among light having passed through the green phosphor layer; and
        a red light portion disposed on the red phosphor layer and blocking light of a predetermined wavelength among light having passed through the red phosphor layer.

4. The method of claim 1, wherein:
    the light emitting diodes comprise blue light emitting diodes;
    the phosphor layers comprise:
        a green phosphor layer configured to emit green light through a wavelength conversion of blue light emitted from the blue light emitting diodes;
        a red phosphor layer configured to emit red light through a wavelength conversion of blue light emitted from the blue light emitting diodes; and
        a transparent layer transmitting blue light emitted from the blue light emitting diodes therethrough without a wavelength conversion; and
    the filters of the filter unit comprise:
        a green light portion disposed on the green phosphor layer and blocking light of a predetermined wavelength among light having passed through the green phosphor layer;

a red light portion disposed on the red phosphor layer and blocking light of a predetermined wavelength among light having passed through the red phosphor layer; and a transparent portion disposed on the transparent layer and transmitting light having passed through the transparent layer therethrough without a wavelength conversion.

5. The method of claim 1, wherein:

the light emitting diodes comprise blue light emitting diodes;

the phosphor layers comprise:

a green phosphor layer configured to emit green light through a wavelength conversion of blue light emitted from the blue light emitting diodes;

a red phosphor layer configured to emit red light through a wavelength conversion of blue light emitted from the blue light emitting diodes; and a transparent layer transmitting blue light emitted from the blue light emitting diodes therethrough without a wavelength conversion; and the filters of the filter unit comprise:

wavelength filter units disposed on the green phosphor layer and the red phosphor layer, respectively, and blocking light of a predetermined wavelength among light having passed through the green phosphor layer and the red phosphor layer; and a transparent portion disposed on the transparent layer and transmitting light having passed through the transparent layer therethrough without a wavelength conversion.

6. The method of claim 1, wherein:

the first substrate and the second substrate are coupled to each other to face each other such that the light emitting diodes are electrically connected to the TFTs, respectively; and the first substrate is coupled to the third substrate to face each other.

7. The method of claim 1, further comprising:

forming a blocking layer between the phosphor layers; and forming a light blocking portion between the filters of the filter unit, wherein the blocking layer and the light blocking portion have a different width from each other.

8. A display apparatus comprising:

a first substrate comprising a plurality of light emitting diodes regularly disposed thereon;

a second substrate comprising a thin-film transistor (TFT) panel part comprising a plurality of TFTs configured to drive the light emitting diodes; and a third substrate comprising a light converter, the light converter comprising:

a plurality of phosphor layers to convert wavelengths of light emitted from the light emitting diodes; and a filter unit comprising a plurality of filters having a width greater than a corresponding phosphor layer to block light of a predetermined wavelength among light having passed through the corresponding phosphor layer, wherein:

the first substrate and the second substrate are coupled to face each other;

the light emitting diodes are electrically connected to the TFTs, respectively;

the first substrate and the third substrate are coupled to face each other; and light emitted from the light emitting diodes is converted into at least one of blue light, green light, and red light through the light converter.

9. The display apparatus according to claim 8, wherein:

the light emitting diodes comprise blue light emitting diodes;

the phosphor layers comprise:

a green phosphor layer configured to emit green light through a wavelength conversion of blue light emitted from the blue light emitting diodes;

a red phosphor layer configured to emit red light through wavelength conversion of blue light emitted from the blue light emitting diodes;

a transparent layer transmitting blue light emitted from the blue light emitting diodes therethrough without a wavelength conversion; and a white phosphor layer configured to emit white light through a wavelength conversion of blue light emitted from the blue light emitting diodes; and the filters of the filter unit comprise:

a green light portion disposed on the green phosphor layer and blocking light of a predetermined wavelength among light having passed through the green phosphor layer;

a red light portion disposed on the red phosphor layer and blocking light of a predetermined wavelength among light having passed through the red phosphor layer; and a transparent portion disposed on the transparent layer and the white phosphor layer, and transmitting light having passed through the transparent layer and the white phosphor layer therethrough without a wavelength conversion.

10. The display apparatus according to claim 8, wherein each of the light emitting diodes comprises:

an n-type semiconductor layer;

a p-type semiconductor layer;

an active layer interposed between the n-type semiconductor layer and the p-type semiconductor layer;

an n-type electrode coupled to the n-type semiconductor layer; and a p-type electrode coupled to the p-type semiconductor layer.

11. The display apparatus according to claim 8, wherein the first substrate comprises:

a plurality of support substrates on which the light emitting diodes are disposed, respectively; and a blocking portion disposed between the support substrates, and blocking light emitted from the light emitting diodes.

12. The display apparatus according to claim 8, further comprising an anisotropic conductive film electrically connecting the first substrate to the second substrate.

13. The display apparatus according to claim 8, wherein:

the light emitting diodes comprise ultra-violet (UV) light emitting diodes configured to emit UV light;

the phosphor layers comprise:

a blue phosphor layer configured to emit blue light through a wavelength conversion of UV light emitted from the UV light emitting diodes;

a green phosphor layer configured to emit green light through a wavelength conversion of UV light emitted from the UV light emitting diodes; and a red phosphor layer configured to emit red light through a wavelength conversion of UV light emitted from the UV light emitting diodes; and the filters of the filter unit comprise:

a blue light portion disposed on the blue phosphor layer and blocking light of a predetermined wavelength among light having passed through the blue phosphor layer;

a green light portion disposed on the green phosphor layer and blocking light of a predetermined wavelength among light having passed through the green phosphor layer; and a red light portion disposed on the red phosphor layer and blocking light of a predetermined wavelength among light having passed through the red phosphor layer.

14. The display apparatus according to claim 13, wherein:

the blue light portion is configured to pass only the blue light therethrough;

the green light portion is configured to pass only the green light therethrough; and the red light portion is configured to pass only the red light therethrough.

15. The display apparatus according to claim 8, wherein:

the light emitting diodes comprise blue light emitting diodes;

the phosphor layers comprise:

a green phosphor layer configured to emit green light through a wavelength conversion of blue light emitted from the blue light emitting diodes;

a red phosphor layer configured to emit red light through a wavelength conversion of blue light emitted from the blue light emitting diodes; and a transparent layer transmitting blue light emitted from the blue light emitting diodes therethrough without a wavelength conversion; and the filters of the filter unit comprise:

wavelength filter units disposed on the green phosphor layer and the red phosphor layer, respectively, and blocking light of a predetermined wavelength among light having passed through the green phosphor layer and the red phosphor layer; and a transparent portion disposed on the transparent layer and transmitting light having passed through the transparent layer therethrough without a wavelength conversion.

16. The display apparatus according to claim 15, wherein the wavelength filter unit is configured to pass green light and red light therethrough and block blue light.

17. The display apparatus according to claim 8, wherein:

the light emitting diodes comprise blue light emitting diodes;

the phosphor layers comprise:

a green phosphor layer configured to emit green light through a wavelength conversion of blue light emitted from the blue light emitting diodes;

a red phosphor layer configured to emit red light through a wavelength conversion of blue light emitted from the blue light emitting diodes; and a transparent layer configured to transmit blue light emitted from the blue light emitting diodes therethrough without a wavelength conversion; and the filters of the filter unit comprise:

a green light portion disposed on the green phosphor layer and blocking light of a predetermined wavelength among light having passed through the green phosphor layer;

a red light portion disposed on the red phosphor layer and blocking light of a predetermined wavelength among light having passed through the red phosphor layer; and a transparent portion disposed on the transparent layer and transmitting light having passed through the transparent layer therethrough without a wavelength conversion.

18. The display apparatus according to claim 17, wherein:

the green light portion is configured to pass only the green light therethrough; and the red light portion is configured to pass only the red light therethrough.

19. The display apparatus according to claim 17, wherein:

the phosphor layers further comprise a blocking layer disposed between the green phosphor layer, the red phosphor layer, and the transparent layer; and the filter unit further comprises a light blocking portion disposed between the green light portion, the red light portion, and the transparent portion.

20. The display apparatus according to claim 19, wherein the blocking layer and the light blocking portion have a different width from each other.

* * * * *